United States Patent
Folts et al.

(10) Patent No.: US 8,532,725 B2
(45) Date of Patent: Sep. 10, 2013

(54) PARALLEL CONNECTED HTS UTILITY DEVICE AND METHOD OF USING SAME

(75) Inventors: Douglas C. Folts, Baraboo, WI (US); James Maguire, Andover, MA (US); Jie Yuan, South Grafton, MA (US); Alexis P. Malozemoff, Lexington, MA (US)

(73) Assignee: American Superconductor Corporation, Devens, MA (US)

( * ) Notice: Subject to any disclaimer, the term of this patent is extended or adjusted under 35 U.S.C. 154(b) by 671 days.

(21) Appl. No.: 12/692,793

(22) Filed: Jan. 25, 2010

(65) Prior Publication Data

US 2010/0149707 A1 Jun. 17, 2010

Related U.S. Application Data

(62) Division of application No. 11/673,281, filed on Feb. 9, 2007.

(51) Int. Cl.
*H01B 12/00* (2006.01)
*H02H 9/00* (2006.01)

(52) U.S. Cl.
USPC ........... 505/230; 505/231; 505/850; 505/856; 174/125.1; 361/19; 361/58

(58) Field of Classification Search
USPC ......... 505/100, 150, 211, 230–238, 430–431, 505/450, 704–705; 174/125.1; 29/599; 361/19, 93.1, 93.7–93.9
See application file for complete search history.

(56) References Cited

U.S. PATENT DOCUMENTS

| | | | |
|---|---|---|---|
| 3,343,035 A | 9/1967 | Garwin | |
| 3,612,897 A | 10/1971 | Kanngiesser | |
| 4,370,609 A | 1/1983 | Wilson et al. | |
| 4,375,659 A | 3/1983 | Cunningham et al. | |
| 5,210,674 A | 5/1993 | Yamaguchi et al. | |

(Continued)

FOREIGN PATENT DOCUMENTS

| CA | 2529661 A1 | 12/2005 |
|---|---|---|
| CN | 1813317 | 8/2006 |

(Continued)

OTHER PUBLICATIONS

Funaki, K., et al. "Development of a 500 kVA-class Oxide-Superconducting Power Transformer Operated at Liquid-Nitrogen Temperature," Cryogenics, Feb. 1, 1998, pp. 211-220, vol. 38, No. 2.

(Continued)

*Primary Examiner* — Stanley Silverman
*Assistant Examiner* — Kallambella Vijayakumar
(74) *Attorney, Agent, or Firm* — Occhiuti Rohlicek & Tsao LLP

(57) ABSTRACT

A method of controlling fault currents within a utility power grid is provided. The method may include coupling a superconducting electrical path between a first and a second node within the utility power grid and coupling a non-superconducting electrical path between the first and second nodes within the utility power grid. The superconducting electrical path and the non-superconducting electrical path may be electrically connected in parallel. The superconducting electrical path may have a lower series impedance, when operated below a critical current level, than the non-superconducting electrical path. The superconducting electrical path may have a higher series impedance, when operated at or above the critical current level, than the non-superconductor electrical path.

14 Claims, 9 Drawing Sheets

(56) References Cited

U.S. PATENT DOCUMENTS

| | | | |
|---|---|---|---|
| 5,432,669 A * | 7/1995 | Nemoto et al. | 361/143 |
| 5,801,124 A | 9/1998 | Gamble et al. | |
| 5,859,386 A | 1/1999 | Herrmann et al. | |
| 5,943,204 A | 8/1999 | Jones et al. | |
| 6,081,987 A | 7/2000 | Kalsi et al. | |
| 6,230,033 B1 | 5/2001 | Scudreie et al. | |
| 6,262,375 B1 | 7/2001 | Engelhardt et al. | |
| 6,275,365 B1 | 8/2001 | Kalsi et al. | |
| 6,444,917 B1 | 9/2002 | Scudiere et al. | |
| 6,453,248 B1 | 9/2002 | Hart et al. | |
| 6,649,280 B1 | 11/2003 | Scudiere et al. | |
| 6,743,984 B2 | 6/2004 | Nassi et al. | |
| 7,048,840 B1 | 5/2006 | Werfel et al. | |
| 7,071,148 B1 | 7/2006 | Selvamanickam et al. | |
| 7,135,988 B2 | 11/2006 | Kawai et al. | |
| 7,304,826 B2 | 12/2007 | Yuan et al. | |
| 7,345,858 B2 | 3/2008 | Lee et al. | |
| 7,521,082 B2 | 4/2009 | Selvamanickam | |
| 7,598,458 B2 | 10/2009 | Yumura et al. | |
| 7,724,482 B2 | 5/2010 | Folts et al. | |
| 7,895,730 B2 | 3/2011 | Baldwin et al. | |
| 7,902,461 B2 | 3/2011 | Folts et al. | |
| 2002/0019315 A1 * | 2/2002 | Nassi et al. | 505/150 |
| 2002/0027014 A1 | 3/2002 | Mukoyama et al. | |
| 2002/0098985 A1 | 7/2002 | Ladie' et al. | |
| 2002/0105231 A1 | 8/2002 | Koeppe et al. | |
| 2002/0144838 A1 | 10/2002 | Fritzemeier et al. | |
| 2002/0190419 A1 | 12/2002 | Albrecht et al. | |
| 2003/0059652 A1 | 3/2003 | Wang et al. | |
| 2003/0183410 A1 | 10/2003 | Sinha et al. | |
| 2004/0058822 A1 | 3/2004 | Ohmatsu | |
| 2004/0194290 A1 | 10/2004 | Dickinson | |
| 2004/0266628 A1 * | 12/2004 | Lee et al. | 505/238 |
| 2005/0007227 A1 | 1/2005 | Lee et al. | |
| 2005/0173149 A1 | 8/2005 | Gouge et al. | |
| 2006/0040830 A1 | 2/2006 | Thieme et al. | |
| 2006/0049027 A1 | 3/2006 | Iversen | |
| 2006/0073979 A1 | 4/2006 | Thieme et al. | |
| 2006/0125421 A1 | 6/2006 | Costa | |
| 2006/0175078 A1 | 8/2006 | Yumura et al. | |
| 2007/0179063 A1 | 8/2007 | Malozemoff et al. | |
| 2007/0278020 A1 | 12/2007 | Harris et al. | |
| 2008/0103630 A1 | 5/2008 | Eckroad | |
| 2008/0168282 A1 | 7/2008 | Brundridge | |
| 2008/0190637 A1 | 8/2008 | Folts et al. | |
| 2008/0190646 A1 | 8/2008 | Folts et al. | |
| 2008/0191561 A1 | 8/2008 | Folts et al. | |
| 2008/0194411 A1 | 8/2008 | Folts et al. | |
| 2010/0173784 A1 | 7/2010 | Lee et al. | |
| 2011/0177954 A1 | 7/2011 | Gamble et al. | |
| 2012/0110350 A1 | 5/2012 | Horvath et al. | |

FOREIGN PATENT DOCUMENTS

| | | | |
|---|---|---|---|
| DE | 1513827 A1 | 9/1969 | |
| EP | 0428993 A2 | 5/1991 | |
| EP | 0504895 A2 | 9/1992 | |
| EP | 1376709 A1 | 1/2004 | |
| GB | 2332558 A | 6/1999 | |
| JP | 08088132 A | 4/1996 | |
| JP | 08088312 A | 4/1996 | |
| JP | 2003500985 A | 1/2003 | |
| JP | 2003141946 A | 5/2003 | |
| JP | 2005029509 | 3/2005 | |
| JP | 2005150469 A | 6/2005 | |
| JP | 2005538672 | 12/2005 | |
| KR | 1020060107273 A | 10/2006 | |
| WO | 9403955 A1 | 2/1994 | |
| WO | 9929006 A1 | 6/1999 | |
| WO | 0070631 A2 | 11/2000 | |
| WO | 03047006 A2 | 6/2003 | |
| WO | 2004004090 A1 | 1/2004 | |
| WO | 2004023623 A1 | 3/2004 | |
| WO | 2007015924 A1 | 2/2007 | |

OTHER PUBLICATIONS

Zueger, H., "630 kVA High Temperature Superconducting Transformer," Cryogenics, Nov. 1, 1998, pp. 1169-1172, vol. 38, No. 11.

Sykulski, J.K., et al., "Prospects for Large High-Temperature Superconducting Power Transformers: Conclusions From a Design Study," IEE Proceedings: Electric Power Applications, Institution of Electrical Engineers, GB, dated Jan. 11, 1999, pp. 41-52, vol. 146, No. 1.

Reis, Chandra, et al., "Development of High Temperature Superconducting Power Transformers," IEEE Power Engineering Society Winter Meeting, Jan. 28, 2001, pp. 432-437.

International Search Report and Written Opinion, dated Jun. 9, 2008, received in international patent application No. PCT/US2008/052307, 14 pgs.

International Search Report and Written Opinion, dated Jun. 10, 2008, received in international patent application No. PCT/US2008/052290, 12 pgs.

Annex to Form PCT/ISA/206, Communication Relating to the Results of the Partial International Search, dated Jun. 12, 2008, received in international patent application No. PCT/US2008/052302, 2 pgs.

Verhaege, et al., "HTS materials for ac current transport and fault current limitation", IEEE Transactions on Applied Superconductivity article, Mar. 2001, vol. 11, No. 1, pp. 2503-2506. (4 pages).

Paasi, et al., "Design Performance of a Superconducting Power Link", IEEE Transactions on Applied Superconductivity article, Mar. 2001, vol. 11, No. 1, pp. 1928-1931. (4 pages).

Kraemer, et al., "Switching Behavior of YBCO Thin Film Conductors in Resistive Fault Current Limiters", German Federal Ministry for Education, Science and Technology article, Aug. 2005 (4 pages).

Serres, et al., "Current Limitation in High Temperature Superconducting Transformers and Impact on the Grid", Cigre Session article, 2000 12-205 (6 pages).

Maguire, et al., "Development and Demonstration of a Long Length HTS Cable to Operate in the Long Island Power Authority Transmission Grid", Session 1LT01 HTS Power Cables-III, pp. 1-7, Manuscript received Oct. 5, 2004 (7 pages).

Noe, et al., "High-temperature superconductor fault current limiters: concepts, applications, and development status", Superconductor Science and Technology 20, 2007, R15-R29 (15 pages).

Usoskin, et al., "SUPEROLI Fault-Current Limiters Based on YBCO-Coated Stainless Steel Tapes", IEEE Transactions on Applied Superconductivity, vol. 13, No. 2, Jun. 2003, pp. 1972-1975 (4 pages).

Zhang, et al., "Developmental of low thermal conductivity Ag—Au alloy sheath Bi-2223 tape and design of 20kA HTS current lead" Physica-C, 2004, 412-414, 1217-1220.

Du, et al., "Quench Protection of Bi2223/Ag Tape Using SFCL made of YBCO thin film," IEEE Trans. ppl. Superconduct. Jun. 2007, 17(2), 1891-1894.

Resivity of Copper, The Physics Factbook, Ed by Glenn Elert, 2004, p. 1-2.

Norris, W.T., et al, "Fault Current Limiters Using Superconductors," Cryogenics, Oct. 1, 1997, pp. 657-665, V. 37, No. 10, Elsevier Science Ltd., Great Britain.

International Preliminary Report on Patentability with Written Opinion, dated Aug. 20, 2009, received in international patent application No. PCT/US08/052290, 8 pgs.

International Preliminary Report on Patentability with Written Opinion, dated Aug. 20, 2009, received in international patent application No. PCT/US08/052293, 8 pgs.

International Preliminary Report on Patentability with Written Opinion, dated Aug. 20, 2009, received in international patent application No. PCT/US08/052302, 9 pgs.

International Preliminary Report on Patentability with Written Opinion, dated Aug. 20, 2009, received in international patent application No. PCT/US08/052307, 7 pgs.

Noe, et al., "Supraleitende Strombegrenzer in Der Energietechnik," Elektrie, Jan. 1, 2007, pp. 414-424, V. 51, No. 11/12, Veb Verlag TEchnik, Berlin.

International Search Report with Written Opinion, dated Sep. 17, 2008, received in international patent application No. PCT/US2008/052302, 15 pgs.
International Search Report with Written Opinion, dated Sep. 19, 2008, received in international patent application No. PCT/US2008/052293, 14 pgs.
Office Action dated Mar. 22, 2011 received in Chinese patent application No. CN200880011213.7 (8 pages).
Office Action dated Jun. 16, 2010 received in Canadian patent application No. CA2678251 (3 pages).
Office Action (Notification of Reason for Refusal) dated Jul. 6, 2012 received in related Japanese patent application No. 2009549170, (5 pages).
English Translation of Office Action (Notification of Reason for Refusal) dated Jul. 6, 2012 received in related Japanese patent application No. 2009549170, (4 pages).
Ise et al., "Characteristics of a 40K VA three phase superducting transformer and its parallel operation with a conventional transformer", IEEE Transactions on Applied Superconductivity, Jun. 1995, vol. 5, No. 2 (4 pages).
Poggiani, "Cabling for cryogenic Virgo," VIR-NOT-PIS-1390, Issue-I, Mar. 2007, Virgo-Ajoint CNRS-INFN Project, European Gravitational Observatory, Cascina (Italy) (9 pages).
Ritter, "Resistivity of Copper", The Physics Factbook, edited by Glenn Elert, Dec. 2004 (2 pages).
Ugur, "Resistivity of Steel", The Physics Factbook, edited by Glenn Elert, Dec. 2006 (2 pages).
Harris et al., "The Tres Amigas Superstation Project", Nov. 5, 2009, retrieved from internet http://www.tresamigasllc.com/docs/epri-discussion.pdf (46 pages).
Malozemoff, et al., "HTS Wire at Commerical Performance Levels", IEEE transactions on Applied Superconductivity, vol. 9, No. 2, Jun. 1999 (5 pages).
Ishiyama et al., Normal Transition and Propogation Characteristics of YBCO Tape, IEEE Transactions on Applied Superconductivity, vol. 15, No. 2, Jun. 2005 (4 pages).
Mutlu et al., "Non-Vacuum YBCO Films on Buffer Layered Ni Tapes: Processing, Growth and Properties", IEEE Transactions on Applied Superconductivity, vol. 10, No. 1, Mar. 2000 (4 pgs.).
Lee et al., "Cryogenic Regrigeration System for HTS Cables", IEEE transactions on Applied Superconductivity, vol. 15, No. 2, Jun. 2005, (4 pages).
Office Action dated Jun. 10, 2010 received in Canadian patent application No. CA2677680 (7 pages).
Office Action dated Sep. 30, 2011 received in related Korean patent application No. 10-2011-7019579 (4 pages).
English Translation of Abstract of JP2003141946, (1 page).
English Translation of Abstract of JP2003500985 not available, Abstract of corresponding document WO0070631 provided, (1 page).
English Translation of Abstract of JP2005538672 not available, Abstract of corresponding document WO2004023623 provided, (1 page).
English translation of Abstract of JP2005150469, (1page).
English translation of Abstract of CN1813317, (1page).
English translation of Abstract of KR1020060107273, (1page).
Annex to Form PCT/ISA, Communication relating to the Results of the Partial International Search mailed Apr. 5, 2012, received in International patent application No. PCT/US11/21849, (3 pages).
Schmidt, et al., "Investigation of YBCO Coated Conductors for Fault Current Limiter Applications", IEEE Transactions on Applied Superconductivity, vol. 17, No. 2, Jun. 2007, pp. 3471-3474.
Johnson et al., "An Industrial Power Distribution System Featuring UPS Properties", IEEE, US vol. 4, CONF 24, Jun. 1993, pp. 759-765.
Johnson et al., "High-Temperature Superconducting dc networks", IEEE Transactions on Applied Superconductivity, vol. 4, No. 3, Sep. 1994, pp. 115-120.
International Preliminary Report on Patentability with Written Opinion, mailed Aug. 20, 2009, received in international patent application No. PCT/US08/052307, (7 pages).
International Preliminary Report on Patentability with Written Opinion, mailed Aug. 20, 2009, received in international patent application No. PCT/US08/052290, (8 pages).

* cited by examiner

PARALLEL CONNECTED HTS UTILITY DEVICE AND METHOD OF USING SAME

RELATED APPLICATIONS

This application is a divisional application of a co-pending U.S. Application having U.S. application Ser. No. 11/673,281, filed on Feb. 9, 2007, entitled "Parallel Connected HTS Utility Device and Method of Using Same", the contents of which are incorporated by reference in its entirety.

TECHNICAL FIELD

This disclosure relates to HTS devices and, more particularly, to HTS devices configured to operate as fault current limiting devices.

BACKGROUND

As worldwide electric power demands continue to increase significantly, utilities have struggled to meet these increasing demands both from a power generation standpoint as well as from a power delivery standpoint. Delivery of power to users via transmission and distribution networks remains a significant challenge to utilities due to the limited capacity of the existing installed transmission and distribution infrastructure, as well as the limited space available to add additional conventional transmission and distribution lines and cables. This is particularly pertinent in congested urban and metropolitan areas, where there is very limited existing space available to expand capacity.

Power cables using high temperature superconductor (HTS) wire are being developed to increase the power capacity in utility power transmission and distribution networks, while maintaining a relatively small footprint. For this disclosure, HTS is defined as a superconductor with a critical temperature at or above 30° Kelvin, which includes materials such as rare-earth- or yttrium-barium-copper-oxide; thallium-barium-calcium-copper-oxide; bismuth-strontium-calcium-copper-oxide; mercury-barium-calcium-copper-oxide; and magnesium diboride. Such HTS cables allow for increased amounts of power to be economically and reliably provided within congested areas of a utility power network, thus relieving congestion and allowing utilities to address their problems of transmission and distribution capacity.

An HTS power cable uses HTS wire as the primary conductor of the cable (i.e., instead of traditional copper conductors) for the transmission and distribution of electricity. The design of HTS cables results in significantly lower series impedance, when compared to conventional overhead lines and underground cables. Here the series impedance of a cable or line refers to the combination of resistive impedance of the conductors carrying the power, and the inductive impedance associated with the cable architecture or overhead line. For the same cross-sectional area of the cable, HTS wire enables a three to five times increase in current-carrying capacity when compared to conventional alternating current (AC) cables; and up to a ten times increase in current-carrying capacity when compared to conventional direct current (DC) cables.

In addition to capacity problems, another significant problem for utilities resulting from increasing power demand (and hence increased levels of power being generated and transferred through the transmission and distribution networks) are increased "fault currents" resulting from "faults". Faults may result from network device failures, acts of nature (e.g. lightning), acts of man (e.g. an auto accident breaking a power pole), or any other network problem causing a short circuit to ground or from one phase of the utility network to another phase. In general, such a fault appears as an extremely large load materializing instantly on the utility network. In response to the appearance of this load, the network attempts to deliver a large amount of current to the load (i.e., the fault).

Detector circuits associated with circuit breakers monitor the network to detect the presence of a fault (or over-current) situation. Within a few milliseconds of detection, activation signals from the detector circuits may initiate the opening of circuit breakers to prevent destruction of various network components. Currently, the maximum capability of existing circuit breaker devices is 80,000 amps. Many sections of the utility network built over the previous century were built with network devices capable of withstanding only 40,000 to 63,000 amps of fault current. Unfortunately, with increased levels of power generation and transmission on utility networks, fault current levels are increasing to the point where they will exceed the capabilities of presently installed or state-of-the-art circuit breaker devices (i.e. be greater than 80,000 amps). Even at lower fault current levels, the costs of upgrading circuit breakers from one level to a higher one across an entire grid can be very high. Accordingly, utilities are looking for new solutions to deal with the increasing level of fault currents. One such solution in development is a device called an HTS fault current limiter (FCL).

An HTS FCL is a dedicated device interconnected to a utility network that reduces the amplitude of the fault currents to levels that conventional, readily available or already installed circuit breakers may handle. Unfortunately, such standalone HTS FCLs are currently quite large and expensive. Utilities may also use large inductors, but they may cause extra losses, voltage sag and grid stability problems. And, unfortunately, pyrotechnic current limiters (e.g., fuses) need replacement after every fault event. Further, while new power electronic FCLs are under development, they are also expected to be large and expensive.

To protect HTS cables against fault currents, a significant amount of copper is introduced in conjunction with the HTS wire, but this adds to the weight and size of the cable. Often, copper fills the central former in the core of the HTS cable around which the HTS wire is spirally wound, and this prevents the core from being used as a passage for the flow of liquid nitrogen.

It is desirable to improve the way HTS cables handle fault currents and to provide an improved alternative to the use of standalone FCLs or other fault current limiting devices.

SUMMARY OF DISCLOSURE

In a first implementation of this disclosure, a method of controlling fault currents within a utility power grid is provided. The method may include coupling a superconducting electrical path between a first and a second node within the utility power grid and coupling a non-superconducting electrical path between the first and second nodes within the utility power grid. The superconducting electrical path and the non-superconducting electrical path may be electrically connected in parallel. The superconducting electrical path may have a lower series impedance, when operated below a critical current level, than the non-superconducting electrical path. The superconducting electrical path may have a higher series impedance, when operated at or above the critical current level, than the non-superconductor electrical path.

One or more of the following features may be included. The series impedance of the superconducting electrical path, when operating in a non-superconducting mode, may be at least N times the series impedance of the non-superconducting electrical path, and wherein N is greater than 1. In some embodiments, N may be greater than or equal to 3. In some embodiments, N may be greater than or equal to 5.

In some embodiments, the superconducting electrical path may include one superconducting electrical cable, whereby the non-superconducting electrical path is external of the superconducting electrical cable. The superconducting electrical path may include two or more superconducting electrical cables. The non-superconducting electrical path may include at least one non-superconducting electrical cable.

In some embodiments, the non-superconducting electrical path may include at least one non-superconducting electrical overhead line. The non-superconducting electrical path may include at least one of: one or more buses; one or more substations; one or more reactor assemblies; and one or more fast switch assemblies.

In some embodiments, the superconducting electrical cable may include one or more HTS conductors, the method may further include configuring at least one of the one or more HTS conductors to operate in a superconducting mode below a critical current level. The method may also include configuring at least one of the one or more HTS conductors to operate in a non-superconducting mode at or above the critical current level. The superconducting electrical cable may also include one or more HTS conductors and at least one of the HTS conductors is constructed of a material chosen from the group consisting of: rare-earth-barium-copper-oxide; thallium-barium-calcium-copper-oxide; bismuth-strontium-calcium-copper-oxide; mercury-barium-calcium-copper-oxide; and any of the $MgB_2$ magnesium diboride compounds.

In some embodiments, the superconducting electrical path may include a fast switch assembly. The non-superconducting electrical path may include a reactor assembly.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF EXEMPLARY EMBODIMENTS

Overview

Figure 1:
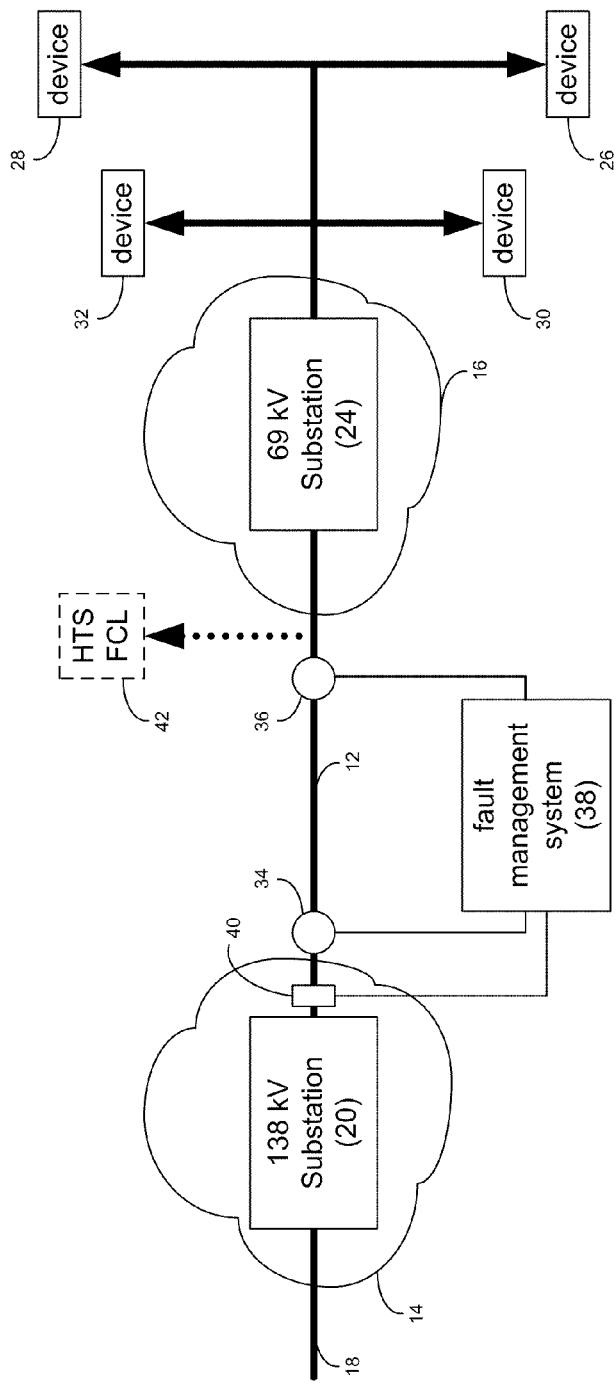
FIG. 1 is a schematic diagram of a copper-cored HTS cable system installed within a utility power grid.

Referring to FIG. 1, a portion of a utility power grid 10 may include a high temperature superconductor (HTS) cable 12. HTS cable 12 may be hundreds or thousands of meters in length and may provide a relatively high current/low resistance electrical path for the delivery of electrical power from generation stations (not shown) or imported from remote utilities (not shown).

The cross-sectional area of HTS cable 12 may be only a fraction of the cross-sectional area of a conventional copper core cable and may be capable of carrying the same amount of electrical current. As discussed above, within the same cross-sectional area, an HTS cable may provide three to five times the current-carrying capacity of a conventional AC cable; and up to ten times the current-carrying capacity of a conventional DC cable. As HTS technology matures, these ratios may increase.

As will be discussed below in greater detail, HTS cable 12 may include HTS wire, which may be capable of handling as much as one-hundred-fifty times the electrical current of similarly-sized copper wire. Accordingly, by using a relatively small quantity of HTS wire (as opposed to a large quantity of copper conductors stranded within the core of a traditional AC cable), an HTS power cable may be constructed that is capable of providing three to five times as much electrical power as an equivalently-sized traditional copper-conductor power cable.

HTS cable 12 may be connected within a transmission grid segment 14 that carries voltages at a level of e.g., 138 kV and extends from grid segment 14 to grid segment 16, which receives this voltage and transforms it to a lower level of e.g., 69 kV. For example, transmission grid segment 14 may receive power at 765 kV (via overhead line or cable 18) and may include a 138 kV substation 20. 138 kV substation 20 may include a 765 kV/138 kV transformer (not shown) for stepping down the 765 kV power received on cable 18 to 138 kV. This "stepped-down" 138 kV power may then be provided via e.g., HTS cable 12 to transmission grid segment 16. Transmission grid segment 16 may include 69 kV substation 24, which may include a 138 kV/69 kV transformer (not shown) for stepping down the 138 kV power received via HTS cable 12 to 69 kV power, which may be distributed to e.g., devices 26, 28, 30, 32. Examples of devices 26, 28, 30, 32 may include, but are not limited to 34.5 kV substations.

The voltage levels discussed above are for illustrative purposes only and are not intended to be a limitation of this disclosure. Accordingly, this disclosure is equally applicable to various voltage and current levels in both transmission and distribution systems. Likewise, this disclosure is equally applicable to non-utility applications such as industrial power distribution or vehicle power distribution (e.g. ships, trains, aircraft, and spacecraft).

One or more circuit breakers 34, 36 may be connected on e.g., each end of HTS cable 12 and may allow HTS cable 12 to be quickly disconnected from utility power grid 10. Fault management system 38 may provide over-current protection for HTS cable 12 to ensure that HTS cable 12 is maintained at a temperature that is below the point at which HTS cable 12 may be damaged.

Fault management system 38 may provide such over-current protection by monitoring the current flowing in the segment of the utility grid to which HTS cable 12 is coupled. For example, fault management system 38 may sense the current passing through 138 kV substation 20 (using e.g., current sensor 40) and may control the operation of breakers 34, 36 based, at least in part, on the signal provided by current sensor 40.

In this example, HTS cable 12 may be designed to withstand a fault current as high as 51 kA with a duration of 200 ms (i.e., 12 cycles of 60 Hz power). The details of fault management system 38 are described in co-pending U.S. patent application Ser. No. 11/459,167, which was filed on 21 Jul. 2006, and is entitled Fault Management of HTS Power Cable. Typically, this requires the HTS cable to contain a significant amount of copper, which helps to carry the high fault current and thus to protect the HTS wires.

Figure 2:
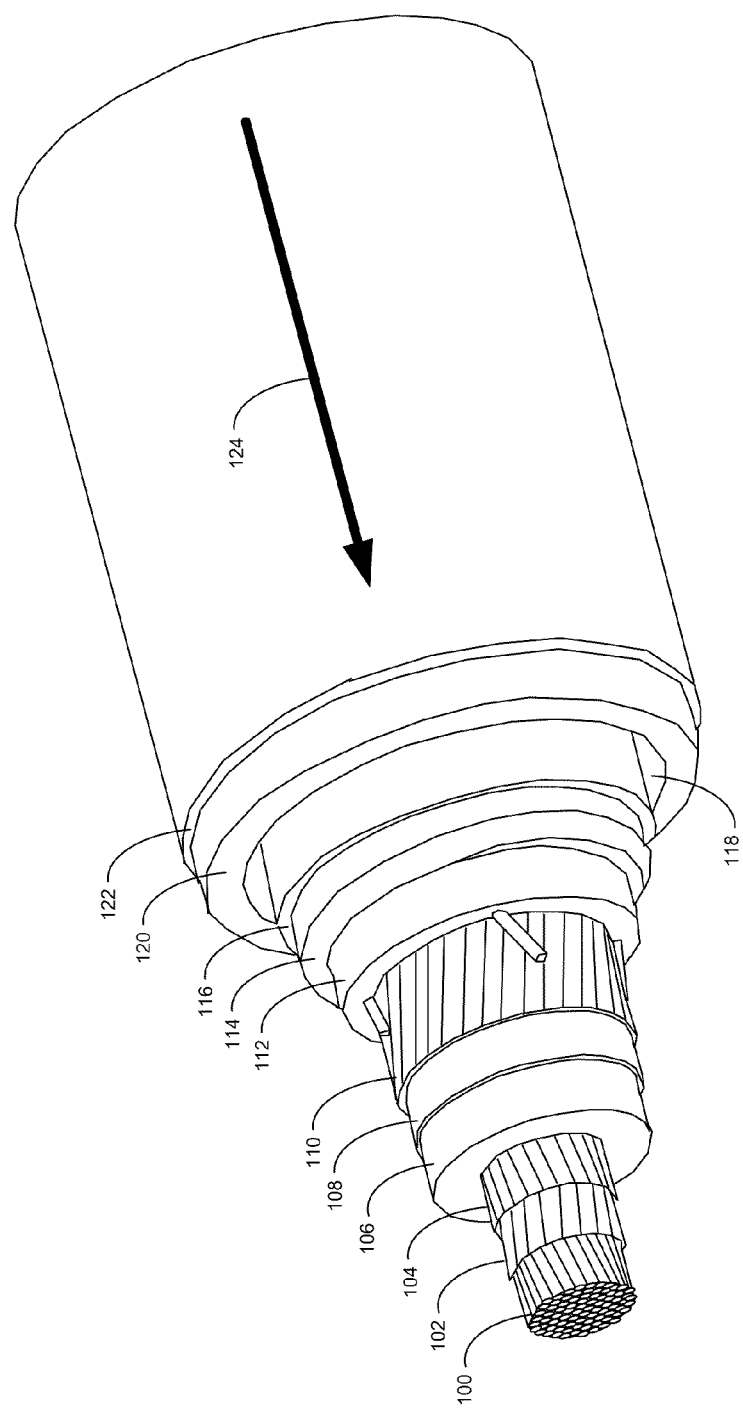
FIG. 2 is an isometric view of the copper-cored HTS cable of FIG. 1.

Referring also to FIG. 2, there is shown a typical embodiment of copper-cored HTS cable 12 that may include stranded copper core 100 surrounded in radial succession by first HTS layer 102, second HTS layer 104, high voltage dielectric insulation layer 106, HTS shield layer 108, copper shield layer 110, coolant passage 112, inner cryostat wall 114, thermal insulation 116, vacuum space 118, outer cryostat wall 120 and an outer cable sheath 122. During operation, a refrigerant (e.g., liquid nitrogen, not shown) may be supplied from an external coolant source (not shown) and may be circulated within and along the length of coolant passage 112.

Additionally/alternatively, additional coaxial HTS layers may be utilized. For example, a third HTS layer (not shown) may be utilized to carry a third phase of current. An example of such a cable arrangement is the Triax HTS Cable arrangement proposed by Ultera (i.e., a joint venture of Southwire Company of Carrollton, Ga. and nkt cables of Cologne, Germany). Other embodiments of HTS cable 12 may include, but are not limited to: warm and/or cold dielectric configurations; single-phase vs. three-phase configurations; and various different shielding configurations (e.g., no shield and cryostat-based shielding).

Copper core 100 and copper shield layer 110 may be configured to carry fault currents (e.g., fault current 124) that may appear within cable 12. For example, when fault current 124 appears within cable 12, the current within HTS layers 102, 104 may dramatically increase to a level that exceeds the critical current level (i.e., $I_c$) of HTS layers 102, 104, which may cause the superconductors to lose their superconducting characteristics (i.e., HTS layers 102, 104 may go "normal"). A typical value for critical current level $I_c$ is 4242 A peak for a cable rated at 3000 $A_{rms}$.

The critical current level in HTS materials may depend upon the choice of electric field level. Conventionally, the critical current level is defined at an electric field level of 1 microvolt/cm, though lower values are also used. However, typically superconductors exhibit a transition region between the zero-resistance (i.e., superconducting) and fully-resistive (i.e., non-superconducting) states as a function of current level. Accordingly, if conductor losses resulting from operation in a state are below those of the fully-resistive state, it may be understood that the superconductor is operating "below the critical current". When current is increased to the point that the conductor losses are essentially those of the fully resistive state, one can understand this to mean the conductor is "above the critical current," and this meaning is used herein. Therefore, in practice, the HTS cable may switch to fully resistive state at a critical current level somewhat above the conventional critical current level defined by the 1 microvolt/cm criterion.

Accordingly, when the critical current level (as defined above) is exceeded, the resistance of HTS layers 102, 104 may increase significantly and may become comparatively very high (i.e., when compared to copper core 100). As the current passing through a plurality of parallel conductors is distributed inversely with respect to the resistance of the individual conductors, the majority of fault current 124 may be diverted to copper core 100, which is connected in parallel with HTS layers 102, 104. This transmission of fault current 124 through copper core 100 may continue until: fault current 124 subsides; or the appropriate circuit breakers (e.g., circuit breakers 34, 36) interrupt the transmission of fault current 124 through HTS cable 12.

By redirecting fault current 124 (or at least a portion thereof) from HTS layers 102, 104 to copper core 100, the overheating of the HTS conductors in HTS cable 12 may be avoided. In the event that fault current 124 (or at least a portion thereof) was not redirected from HTS layers 102, 104 to copper core 100, fault current 124 may heat the HTS conductors in HTS cable 12 significantly due to the high resistance of HTS layers 102, 104, which may result in the formation of gaseous "bubbles" of liquid nitrogen (i.e., due to liquid nitrogen being converted from a liquid state to a gaseous state within coolant passage 112). Unfortunately, the formation of gaseous "bubbles" of liquid nitrogen may reduce the dielectric strength of the dielectric layer and may result in voltage breakdown and the destruction of HTS cable 12. For warm dielectric cable configurations (not shown), fault current not redirected away from HTS layers 102, 104 may simply overheat and destroy HTS layers 102, 104.

Examples of HTS cable 12 may include but are not limited to HTS cables available from Nexans of Paris France; Sumitomo Electric Industries, Ltd., of Osaka, Japan; and Ultera (i.e., a joint venture of Southwire Company of Carrollton, Ga. and nkt cables of Cologne, Germany).

While copper core 100 redirects fault currents (or portions thereof) around HTS layers 102, 104, there are disadvantages to utilizing such an "internal" copper core. For example, copper core 100 may require HTS cable 12 to be physically larger and heavier, which may result in increased cost and greater heat retention within HTS cable 12. Accordingly, more refrigeration may be required to compensate for the additional heat retention, resulting in higher overall system and operating costs. Moreover, the increased heat capacity of copper core 100 and thermal resistance between HTS layers 102, 104 and the coolant due to the dielectric layer may greatly increase recovery times should the energy of a fault current increase the temperature beyond the point where superconductivity can be maintained in HTS layers 102, 104. For example, in the event that a fault current is redirected through copper core 100, it may take several hours for the refrigeration system (not shown) to cool down HTS cable 12 to within the appropriate operating temperature range (e.g., 65-77° Kelvin). The time required to cool down HTS cable 12 to within the operating range of the cable is commonly referred to as the "recovery time", which may be required by utilities to be a few seconds (or less) for transmission devices or a few tenths of a second (or less) for distribution devices. Alternatively, a standalone fault current limiter may be used with HTS cable 12 to limit fault currents; however this has the disadvantage of requiring another large and costly piece of electrical equipment to be installed in the substation linked to HTS cable 12.

Figure 3:
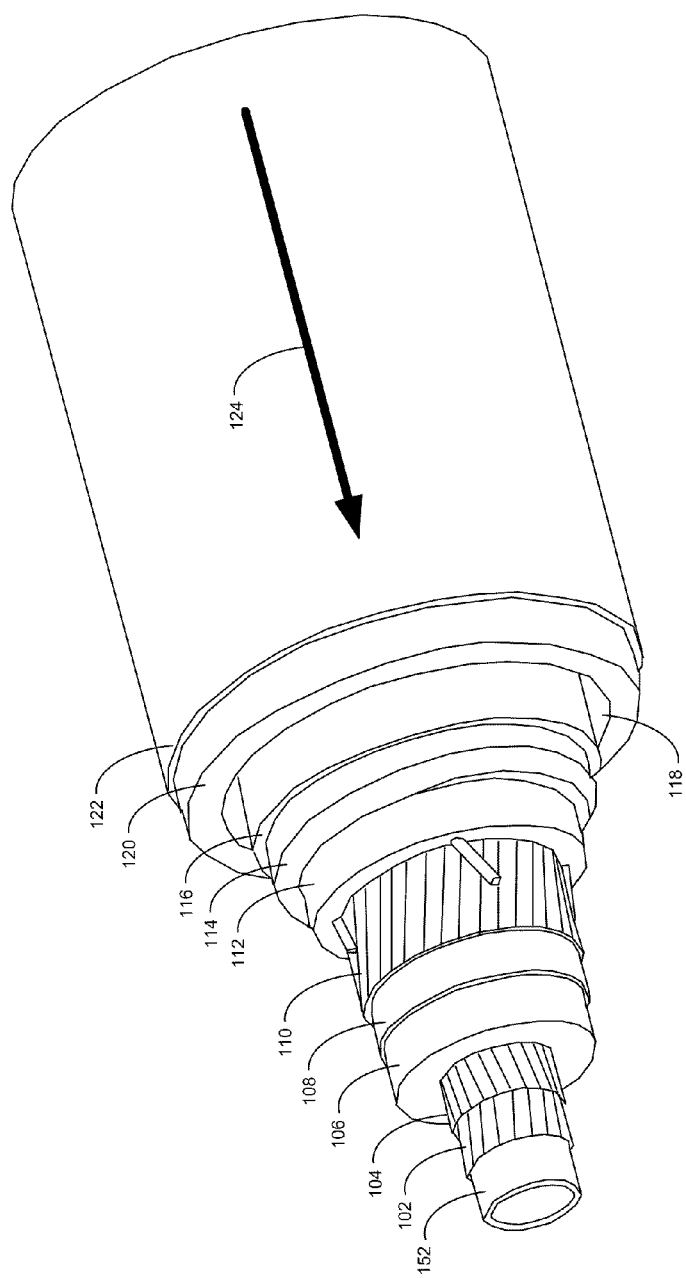
FIG. 3 is an isometric view of a hollow-core HTS cable.

Referring to FIG. 3, there is shown a hollow-core HTS cable 150, according to this disclosure. While HTS cable 150 may include various components of prior art copper-cored HTS cable 12, HTS cable 150 does not include stranded copper core 100 (FIG. 2) in the cable core, but rather it was replaced with a hollow core, such as inner coolant passage 152, through which a refrigerant (e.g., liquid nitrogen) may flow.

In a fashion similar to that of copper-cored HTS cable 12, inner coolant passage 152 may be surrounded in radial succession by first HTS layer 102, second HTS layer 104, high voltage dielectric insulation layer 106, HTS shield layer 108, copper shield layer 110, coolant passage 112, inner cryostat wall 114, thermal insulation 116, vacuum space 118, outer cryostat wall 120 and an outer cable sheath 122. During operation, a refrigerant (e.g., liquid nitrogen, not shown) may be supplied from an external coolant source (not shown) and may be circulated within and along the length of coolant passage 114 and inner coolant passage 152.

Figure 4:
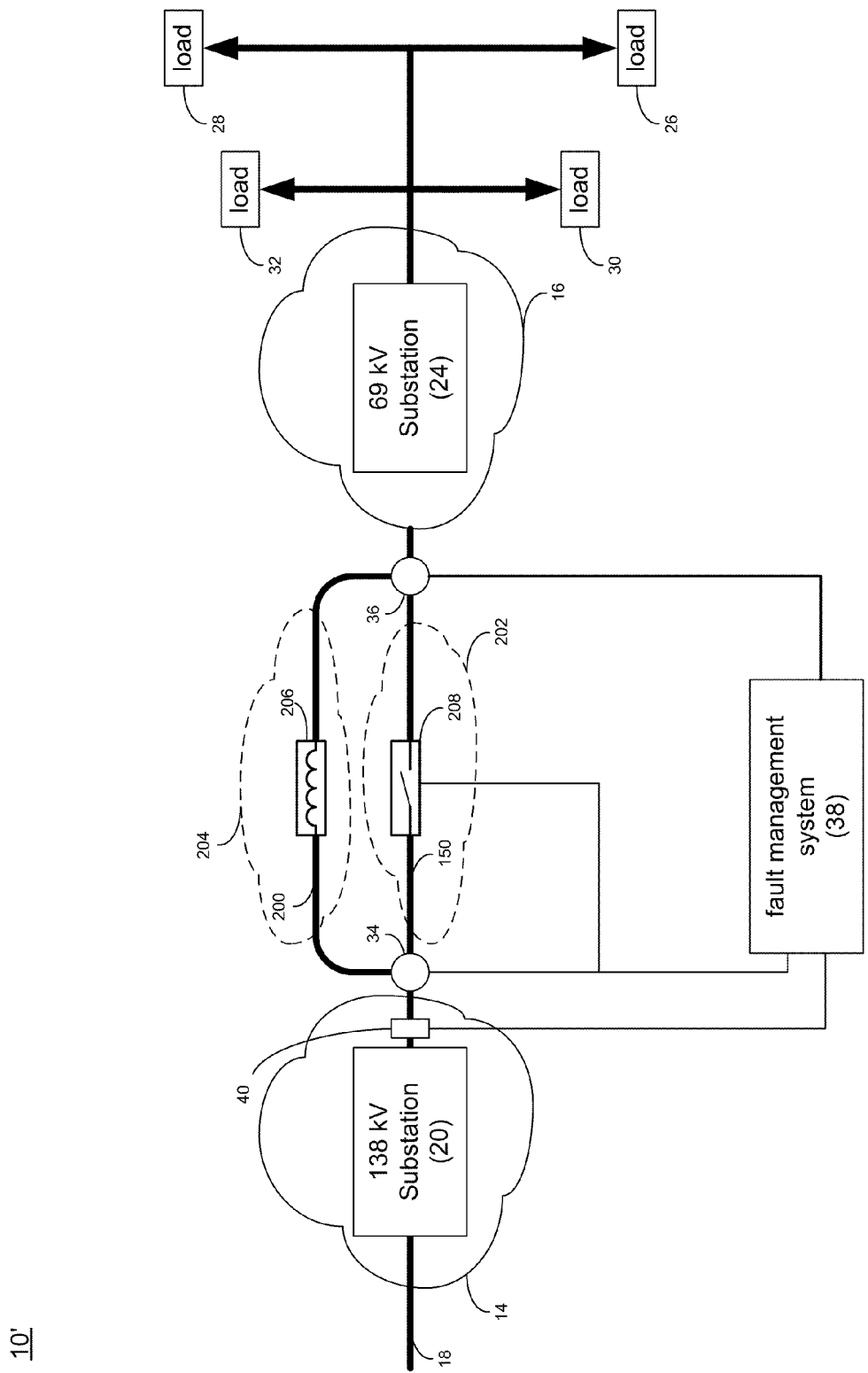
FIG. 4 is a schematic diagram of a hollow-core HTS cable system installed within a utility power grid.

Referring also to FIG. 4, utility power grid portion 10' may include a conventional (i.e. non-superconducting cable) 200, connected in parallel with HTS cable 150. An example of conventional cable 200 includes but is not limited to a 500 kcmil, 138 kV Shielded Triple Permashield (TPS) power cable available from The Kerite Company of Seymour, Conn. Conventional cable 200 may be an existing cable in a retrofit application where HTS cable 150 is being added to replace one or more conventional cables to e.g., increase the power capacity of an electrical grid. Alternatively, conventional cable 200 may be a new conventional cable that is installed concurrently with HTS cable 150 and interconnected with appropriate bus work and circuit breakers.

HTS cable 150 and/or additional HTS cables (not shown) may be included within superconducting electrical path 202, which may include a portion of a power utility grid. Further, superconducting electrical path 202 may include other superconducting power distribution devices, such as buses (not shown), transformers (not shown), fault current limiters (not shown), and substations (not shown).

Conventional cable 200 and/or additional conventional cables (not shown) may be included within non-superconducting electrical path 204, which may include a portion of a power utility grid. Further, non-superconducting electrical path 204 may include other power distribution devices, such as buses (not shown), transformers (not shown), fault current limiters (not shown), and substations (not shown).

By removing copper core 100 (FIG. 2) from the inside of HTS cable 150 and utilizing an external (i.e., with respect to HTS cable 150) parallel-connected conventional cable 200 to carry e.g., fault current 124, HTS cable 150 may be physically smaller, which may result in decreased fabrication cost and lower heat loss from HTS cable 150. Accordingly, HTS cable 150 may require less refrigeration (when compared to HTS cable 12, which has greater heat retention) and may result in lower overall system and operating costs. Further, by moving copper core 100 from the inside of HTS cable 12 to the outside of HTS cable 150 (in the form of conventional cable 200), the heat capacity of HTS cable 150 and the thermal resistance between HTS layers 102, 104 and the coolant are both reduced, thus allowing for quicker recovery times in the event that fault current 124 increase the temperature of HTS cable 150 beyond the point where superconductivity can be maintained in HTS layers 102, 104. By removing the copper core 100 from the inside of the HTS cable 12 and by using an appropriately optimized HTS wire, one can incorporate fault current limiting functionality directly into HTS cable 150, thus removing the need for a separate standalone fault current limiter if one wants to protect the HTS cable or downstream utility equipment from fault currents.

HTS Cable and Fault Current Limiters

Referring again to FIG. 1, if a fault current within grid section 10 causes the current flowing through HTS cable 12 to rise beyond the limits of conventional circuit breakers 34, 36, an HTS FCL device 42 (shown in phantom) or conventional reactor technology (not shown) may be incorporated within grid section 10 to limit the amplitude of the fault current flowing through HTS cable 12 to a level that conventional circuit breakers 34, 36 can interrupt. Under normal conditions, when nominal current levels are flowing in grid section 10, HTS FCL introduces no impedance into the grid. However, when a fault current appears in grid section 10, the current causes the superconductor in HTS FCL 42 to instantaneously go "normal" or non-superconducting and this adds a very large impedance into grid section 10. The HTS FCL 42 is designed to limit the fault current to a predetermined level which is within the interrupting capability of convention circuit breakers.

Standalone HTS FCL devices 42 are being developed by various companies, including American Superconductor Corporation (of Westboro, Mass.) in conjunction with Siemens AG (of Germany). Unfortunately, adding HTS FCL device 42 to grid section 10 may be very costly and may require a significant amount of space to accommodate device 42, which may be difficult to accommodate (especially in urban areas).

According to the present disclosure, an HTS device, e.g. HTS cable 150 (FIG. 4), may be used as a fault current limiter itself without the need to incorporate a separate HTS FCL, such as HTS FCL 42 (FIG. 1). Therefore, the HTS cable itself may be utilized to obtain the desirable effects (e.g., attenuation of fault currents) of a typical standalone HTS FCL while avoiding the undesirable effects (e.g., cost and size) of the typical standalone HTS FCL. In order to achieve the fault current limiting effects, the HTS cable may be placed in parallel with a conventional (i.e., non-superconducting) cable. For example, if superconducting cable 150, and conventional cable 200 are placed in parallel, this combination may be designed and operated to act as a fault current limiting cable system that is described in more detail below.

This disclosure may be applied to other HTS devices as well. For example, if another type of the superconducting device, such as a superconducting transformer (not shown) is placed in parallel with a conventional transformer (not shown), this combination of devices may be designed and operated to act as a fault current limiting system. Alternatively, where fault current attenuation is not required, this arrangement may allow the superconducting transformer to be smaller because not all of the fault current will flow through the superconducting transformer, preferring instead to flow through the conventional transformer. Accordingly, by placing a conventional device in parallel with a superconducting device according to this disclosure, the amplitude of the fault current on the grid may be limited to the desired level (by properly sizing the conventional parallel device and/or the superconducting device), thereby allowing the use of readily available circuit breakers.

During normal operation of the HTS device (e.g., HTS cable 150), the impedance (i.e., both real and reactive) of the HTS device will be significantly lower than that of the conventional device (e.g., conventional cable 200). For example, the typical impedance of HTS cable 150 is essentially 0.00+ j0.007 ohms per kilometer (when superconducting) and 1.35+j0.007 ohms per kilometer (when not superconducting), and the typical impedance of conventional cable 200 is 0.095+j0.171 ohms per kilometer. Note that HTS cable 150 has essentially zero resistance when superconducting. Accordingly, when HTS cable 150 is superconducting, the majority of the current passing through breakers 34, 36 will flow through HTS cable 150 (with very little or zero current passing through conventional cable 200). However, when not superconducting, the vast majority of the current will flow through conventional cable 200 (with only a small fraction flowing through HTS cable 150).

A transient-rated (or fully-rated) reactor assembly 206 may be coupled in series with conventional cable 200. An example of reactor assembly 206 is an air-core dry-type power reactor manufactured by Trench® Limited of Scarborough, Ontario, Canada. Further, a fast switch assembly 208 may be coupled in series with HTS cable 150. An example of fast switch assembly 208 is a 138 kV Type PM Power Circuit Breaker manufactured by ABB Inc. of Greensburg, Pa. One or both of reactor assembly 206 and/or fast switch assembly 208 (e.g., a switch capable of opening in 4 cycles) may be controllable by fault management system 38. For example, upon sensing fault current 124, fault management system 38 may open fast switch assembly 208, resulting in reactor assembly 206 along with the conventional cable absorbing a portion of the power of fault current 124 and effectively isolating HTS cable 150 from fault current 124. The fast switch is also protected by the current limitation from the rapidly switching HTS cable. For multiphase power, a plurality of reactor assemblies 206 and/or fast switch assemblies 208 may be utilized. The fast switch may be reclosed after some minutes when the HTS cable has recovered to its superconducting state.

Figure 5:
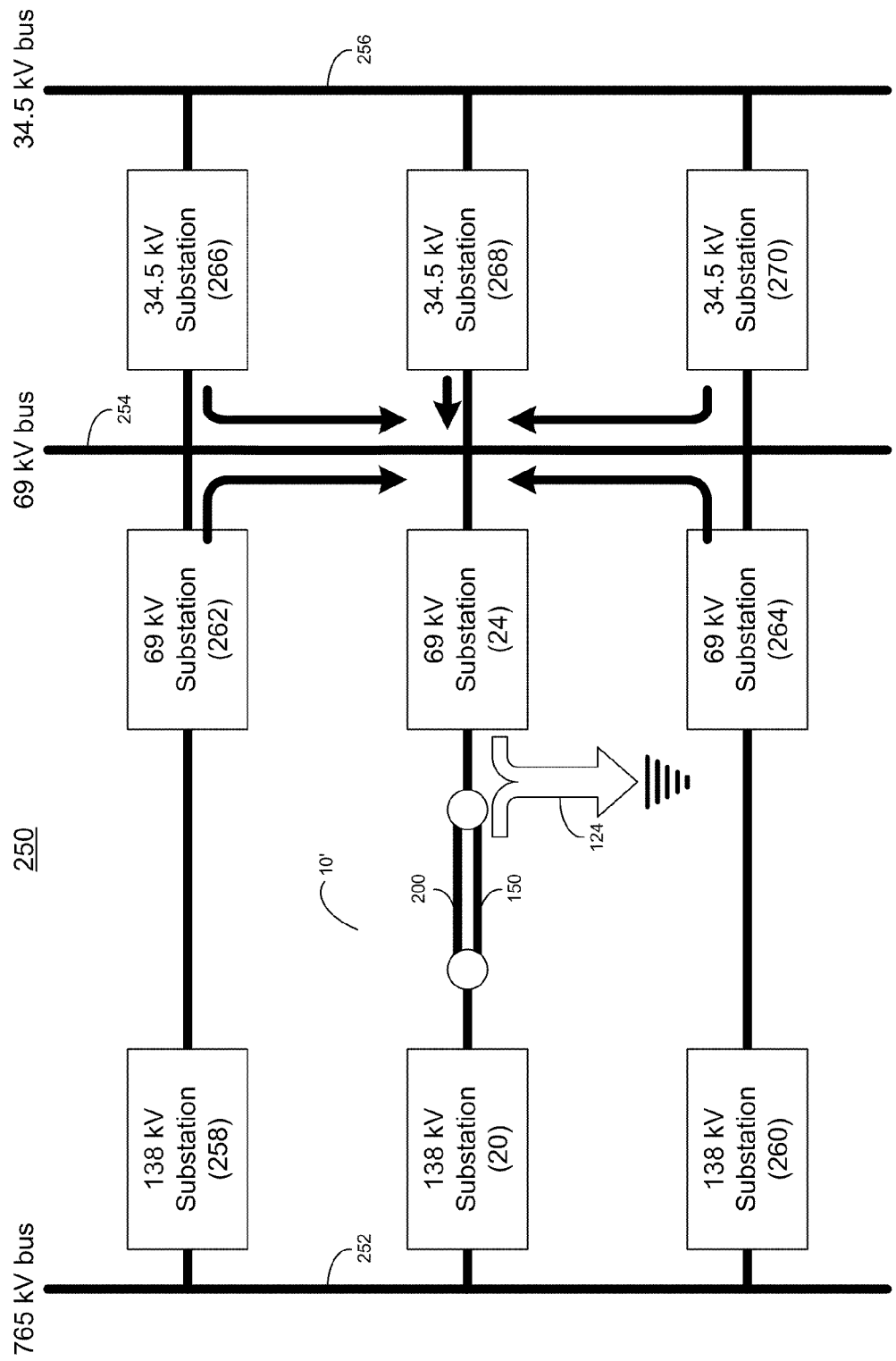
FIG. 5 is a schematic diagram of a utility power grid.

Referring also to FIG. 5, the operation of HTS cable 150 as an FCL within the context of utility power grid 250 is shown. Utility power grid 250 is shown to include 765 kV bus 252, 69 kV bus 254, and 34.5 kV bus 256. Further, utility power grid 250 is shown to include three 138 kV substations 20, 258, 260, each of which provides power to 69 kV bus 254 through three 69 kV substations 24, 262, 264. Three 34.5 kV substations 266, 268, 270 may provide power from 69 kV bus 254 to 34.5 kV bus 256. The HTS cable and FCL system, 150, 200, is shown between substations 20 and 24

When a fault current (e.g., fault current 124) is present within utility power grid 250, current may flow from all interconnected substations through all available paths to feed the fault, which may appear as a very large load placed on utility power grid 250. When calculating the fault currents realizable during a fault condition, the fault may be modeled as a short-circuit to ground.

Figure 6:
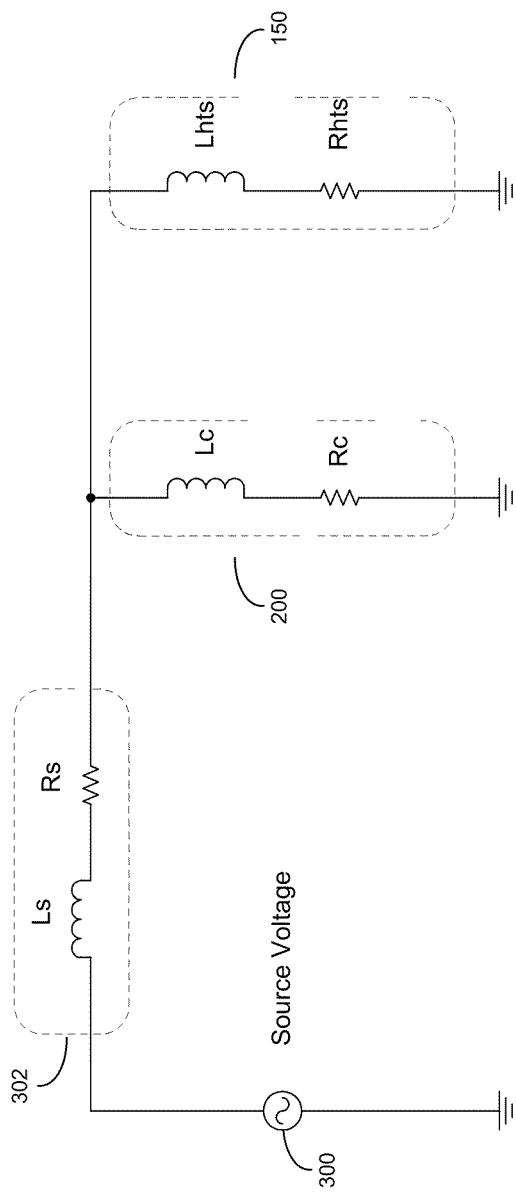
FIG. 6 is a model of a superconducting/conventional cable pair.

Referring also to FIG. 6, when determining how much fault current a particular substation (e.g., 138 kV substation 20) contributes to e.g., fault current 124, the open circuit generation voltage may be modeled as ideal voltage source 300. Further, the impedance of cables 150, 200 may be modeled as their resistive and reactive equivalent circuit elements and upstream impedance may be combined with the transformer impedances and represented as source impedance 302. Impedance in this context may be a complex vector quantity consisting of a real and a reactive component. Mathematically, impedance $Z=R+jX$, where R is the real (i.e., resistive) component and X is the reactive component. In this example, the reactive component is inductive and equal to $j\omega L$, where $\omega=2\pi f$ and f is the frequency of the current flow (e.g. 60 Hz in North America).

The cables may likewise be modeled as a complex impedance. For example, cables 150, 200 are shown terminated to ground because, as discussed above, the fault is modeled as a short circuit to ground. Ohm's Law may be used to determine the expected level of fault current provided by 138 kV substation 20. Using this approach with respect to the other substations with in grid 250, the overall fault current contributions may be calculated and the fault current expected to pass through cable 150 may be determined. The HTS cable 150 and conventional cable 200 may then be designed to limit this otherwise expected fault current 124 to a lower, predetermined level which the conventional circuit breakers are capable of handling.

In designing the HTS device and conventional device to work properly as an FCL, certain criteria must be considered. For example, during a fault condition, HTS cable 150 must be configured to achieve resistance high enough to provide the grid with a sufficient impedance to lower the fault current to the desired level. It also must be high enough relative to the impedance of the conventional cable 200 for the majority of the fault current 124 to flow through conventional cable 200. The design of this voltage divider must be such that the voltage drop across the HTS cable 150 during a fault does not cause the cable temperature to rise to a point where the refrigerant (e.g., liquid nitrogen) changes from a liquid state to a gaseous state. If this were to occur, the dielectric strength of the liquid nitrogen between the high voltage cable core (e.g., HTS layers 102, 104) and the shield (e.g., HTS shield layer 108), would not be maintained and voltage breakdown within HTS cable 150 could occur potentially resulting in destruction of the cable.

The criterion that the HTS device achieve a resistance high enough for the majority of the fault current to be directed through the conventional device is achievable due to the high resistivity of HTS material after transition from superconducting state to normal (i.e., non-superconducting) state. As with all superconductors, as long as temperature, current density, and magnetic field strength remain below certain critical values, current will flow in the superconductor with essentially zero resistance.

Assume that HTS cable 150 is a 600 m long HTS cable rated for 2400 A of continuous current at 138 kV. The HTS conductors (e.g., HTS layers 102, 104) of HTS cable 150 may include twenty-eight strands of HTS wire in parallel. Further, assume that cable 150 is constructed using an HTS conductor 0.44 cm wide, laminated with 300 microns of brass with a resistivity at 90 K of 5.8 microOhm-cm. Then one strand of this conductor has a 90 K resistance of approximately 37.9 Ohms per kilometer. Such an HTS conductor is available from American Superconductor Corporation. Accordingly, the cable resistance per phase would be 37.9 $\Omega$/km*2.6 km*1.08/28 strands=3.80$\Omega$. The 1.08 factor results from the spiral cabling process which requires each strand be longer than the length of HTS cable 150. For conventional cable 200, the impedance is 2.6 km*(0.095+j0.17) $\Omega$/km=0.25+j0.44$\Omega$. Accordingly, while HTS cable 150 has an impedance value when superconducting that is substantially lower (i.e., 1.35+j0.007 $\Omega$/km) than conventional cable 200, when HTS cable 150 is not superconducting (e.g., when a high temperature condition occurs), the impedance of HTS cable 150 is substantially higher (having an impedance of 1.35+j0.007 $\Omega$/km) than conventional cable 200 (having an inductive impedance of 0.095+j0.17 $\Omega$/km).

Figure 7:
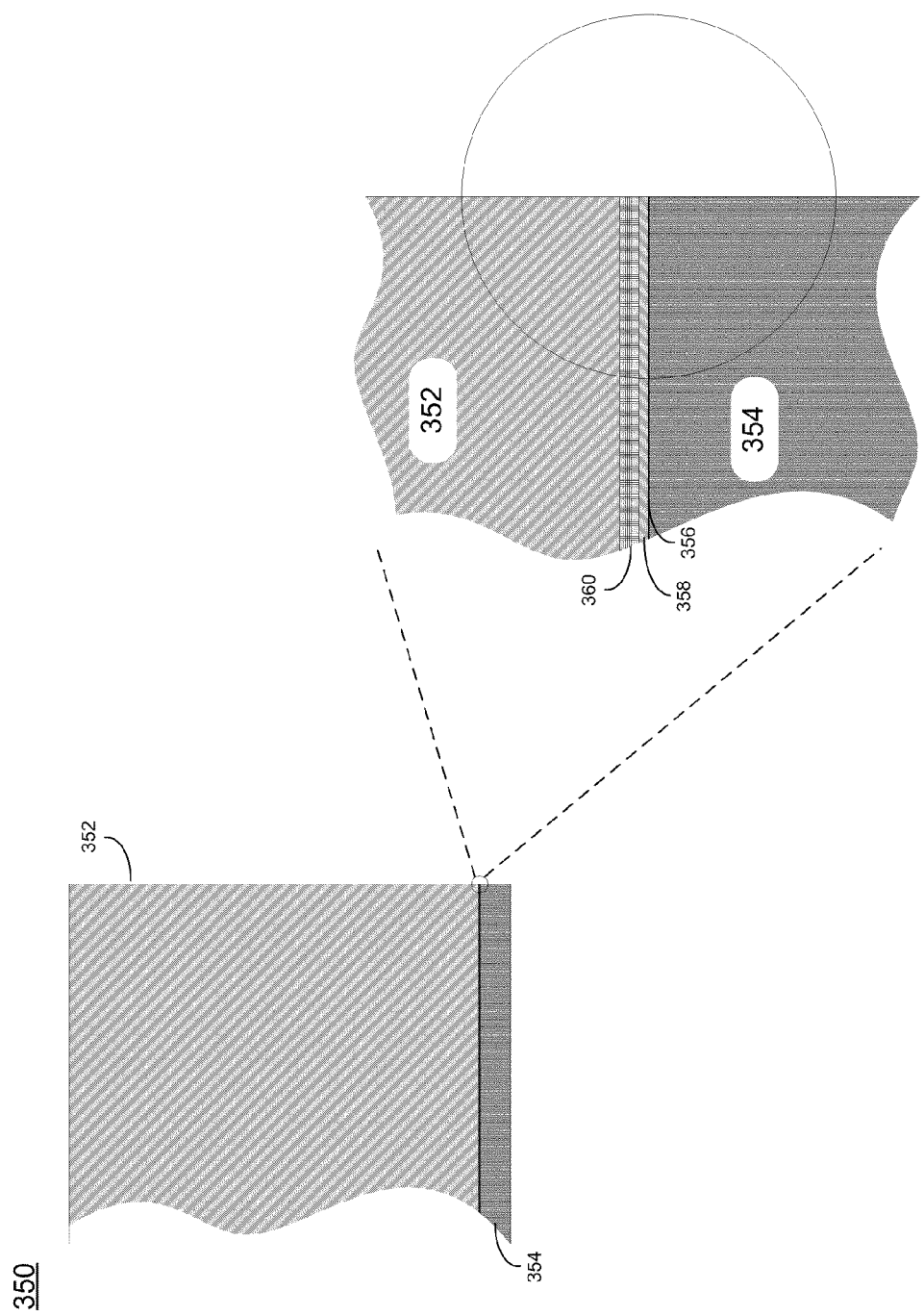
FIG. 7 is a cross-sectional view of an HTS wire.

Referring also to FIG. 7, there is shown a cross-sectional view of one HTS conductor 350 used to construct HTS layers 102, 104. In this example, HTS conductor 350 used in HTS layers 102, 104 is shown to include a stabilizer layer 352 and substrate 354. An example of stabilizer layer 352 may include but is not limited to brass, copper, stainless steel. An example of substrate 354 may include but is not limited to nickel-tungsten, stainless steel and Hastelloy. Positioned between stabilizer layer 352 and substrate 354 may be buffer layer 356, HTS layer 358 (e.g., a yttrium-barium-copper-oxide layer), and cap layer 360. An example of buffer layer 356 is the combination of yttria, yttria-stabilized zirconia, and cerium oxide ($CeO_2$), and an example of cap layer 360 is silver. A solder such as SnPbAg may be used to bond the stabilizer layer to the substrate on one side and the silver cap layer on the other.

Figure 8:
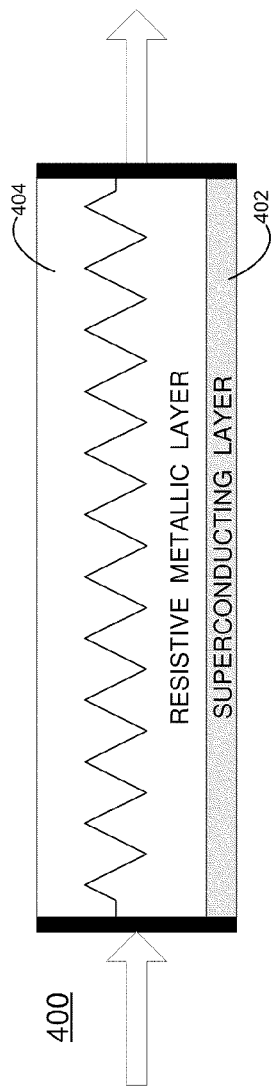
FIG. 8 is a model of the HTS wire of FIG. 7.

Referring also to FIG. 8, an equivalent electrical model 400 of HTS conductor 350 is shown. For illustrative purpose, equivalent electrical model 400 illustrates HTS conductor 350 as a superconducting layer 402 on the lower half of model 400 and all other wire structures combined to form resistive metallic layer 404 on the upper half of model 400. When HTS conductor 350 is in superconducting mode, all current flows within the essentially zero resistance superconducting layer 402. When in non-superconducting mode, current flows within resistive metallic layer 404, consisting principally of the stabilizer.

Figure 9:
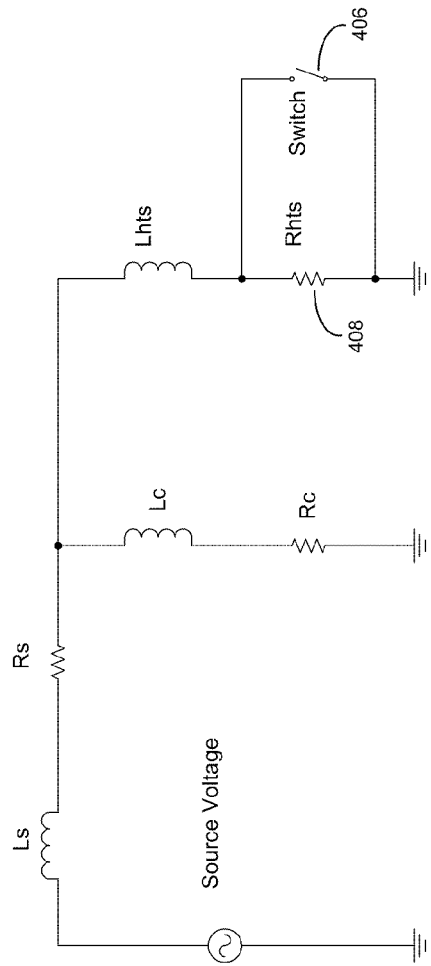
FIG. 9 is an alternative model of the superconducting/conventional cable pair of FIG. 6.

Referring also to FIG. 9 and as discussed above, exceeding a critical current level is what differentiates between HTS conductor 350 functioning in a superconducting mode or in a non-superconducting mode. HTS conductor 350 may be modeled to include a switch 406 that, for low currents (i.e., below the critical current level), is closed and shunts the resistance 408 of metallic layer 404. Accordingly, when switch 406 is closed, all current flows through superconducting layer 402, which is modeled as zero resistance. When the critical current level is exceeded, superconducting layer 402 may become highly resistive and switch 406 may be opened, resulting in all current flowing through resistive metallic layer 404.

Figure 10:
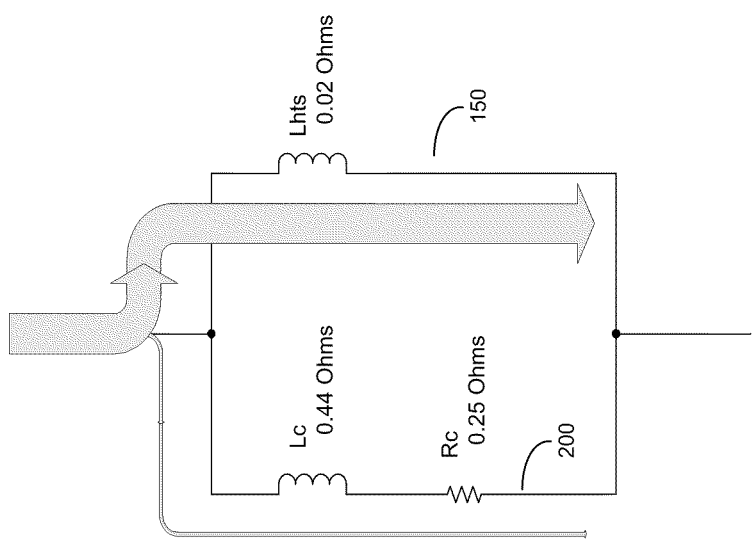
FIG. 10 is a model of the superconducting/conventional cable pair of FIG. 9 during superconducting mode.

Referring also to FIG. 10, there is shown a model of the combination of HTS cable 150 and conventional cable 200 during superconducting operation mode. For this model, assume a typical source voltage of 79.7 kV line-to-ground and a source impedance of 0.155+j1.55 Ohms (Vs, Ls, and Rs in FIG. 6). These values result in a fault current of 51kA for a fault in substation 20 ahead of the cables 150 and 200. Inserting typical real and reactive impedance values for e.g., a 2600 meter cable, during normal operation where current (i.e., below the critical current level) flows from one substation to another substation, the switch is closed and 96% of the current flows within HTS cable 150.

Figure 11:
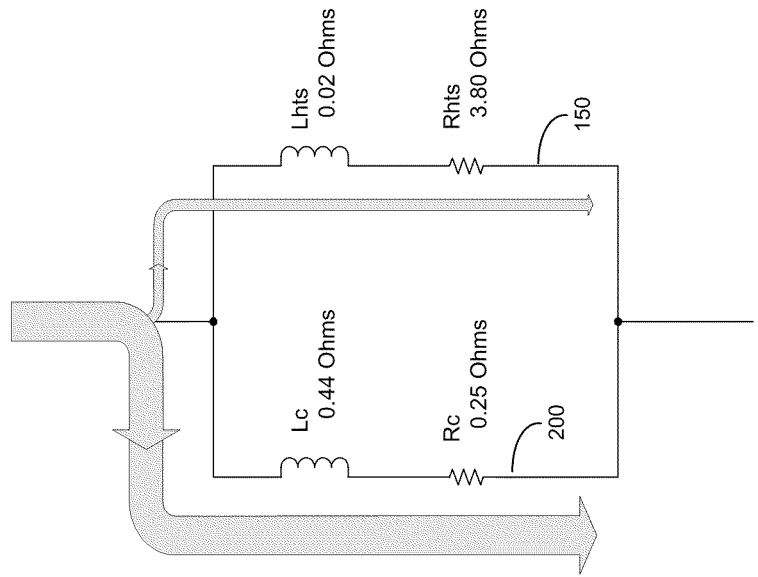
FIG. 11 is a model of the superconducting/conventional cable pair of FIG. 9 during non-superconducting mode.

Referring also to FIG. 11, during a fault condition, the critical current level is met or exceeded, causing switch 410 (FIG. 9) to open. The additional resistance of metallic layer 402 (FIG. 8) of HTS cable 150 may cause the majority of the fault current to flow within conventional cable 200. Specifically, for the values shown, 88% of the fault current flows within conventional cable 200 and 12% within HTS cable 150. Total fault current flowing in cables 150 and 200 is 40kA which is significantly reduced from the 51 kA available. This 20% reduction in available fault current is typical of what may be required of a fault current limiter.

To prevent HTS cable 150 from heating excessively during a fault, several measures may be taken. Typically, fast switch assembly 208 (FIG. 4), which is in series with the HTS cable 150, is opened after e.g., 4 cycles, and is only closed after HTS cable 150 cools to an acceptable starting temperature. Alternatively, circuit breakers 34 and/or circuit breaker 36 may be opened.

To further minimize the temperature rise, stabilizer layer 352 (FIG. 7) may be quite thick (e.g., 300 microns) to increase the heat capacity. At the same time, the resistivity of stabilizer layer 352 maybe chosen at a value to minimize the temperature rise due to resistive heating, while at the same time being high enough to insure that in its switched state, HTS cable 150 has a high enough resistance to insure transfer of a majority of fault current 124 (FIG. 5) to conventional cable 200. Typically, values in the range of 3-10 microOhm-cm at around 90 K fulfill these requirements for typical applications. A convenient material family to achieve such values is brass (Cu—Zn alloy), but many other alloys such as CuNi and CuMn are also possible. These values are provided for illustrative purposes only and are not intended to be a limitation of this disclosure. For example, in the case described above, with 28 parallel HTS wires, each 0.44 cm in width, and with a total of 300 microns of stabilizer with 5 microOhm-cm resistivity provides a resistance of 13 Ohm/km, while the temperature rise during a 4-cycle (0.067 sec) hold time prior to the opening of the fast switch, for an effective critical current of 350 A/cm is about 11 K. For a pressurized cable system with pressures in the range of 15-20 bar, nitrogen bubbles above about 110 K; so this temperature rise is acceptable for operation in the 70-80K temperature range.

Now consider the example of a 600m length of the same cable (i.e. 138 kV, 2400 A and constructed the same way with the same wire characteristics). The source voltage and impedance values of FIG. 9 remain unchanged but now conventional cable impedance is 0.57+j0.10 Ohms and HTS cable impedance is 0.88+j0.005 Ohms in the non-superconducting state. Now fault current is only reduced to 48kA from 51 kA. To reduce the fault current further, a reactor may be inserted in series with the conventional cable. For example, a 1.4 mH reactor has a impedance of 0+j0.53 Ohms and when that impedance is added to the conventional cable impedance (because they are connected in series), the total fault current flowing in the cables is reduced to 40kA.

The net effect of the fault-current limiting cable is to limit current in its branch of the cable system to a level no larger than the critical current, protecting the fast switch and diverting the remaining current to the non-superconducting cable with its series reactor. In the above example, without the use of the fault current limiting HTS cable design according to this disclosure, the fault current in the branch of the cable system may be significantly higher (e.g., an order of magnitude greater). However, precise current levels depend on the impedances and power levels within the electrical path. After the fast switch opens, the non-superconducting cable with its reactor limits the fault current until the circuit breaker opens. Through proper choice of the impedance of the non-superconducting cable and its reactor, the current can be limited to the desired level. After the superconducting cable recovers to its superconducting state after a few minutes, the fast switch can be closed, allowing the system to resume its original operation.

A number of implementations have been described. Nevertheless, it will be understood that various modifications may be made. Accordingly, other implementations are within the scope of the following claims.

What is claimed is:

1. A method of controlling fault currents within a utility power grid comprising:
coupling a superconducting electrical path between a first and a second node within the utility power grid; and
coupling a non-superconducting electrical path between the first and second nodes within the utility power grid;
wherein the superconducting electrical path and the non-superconducting electrical path are electrically connected in parallel;
wherein the superconducting electrical path has a lower series impedance, when operated below a critical current level, than the non-superconducting electrical path, and wherein the superconducting electrical path has a higher series impedance, when operated at or above the critical current level, than the non-superconductor electrical path;

wherein the superconducting electrical cable includes one or more HTS conductors, at least one of the one or more HTS conductors includes a stabilizer layer having a resistivity within a range of 3-10 microOhm-cm at 90 K;

wherein the one or more HTS conductors being configured to allow the superconducting electrical cable to operate, during the occurrence of a fault condition, with a temperature rise within the one or more HTS conductors that is low enough to prevent the formation of gas bubbles within a liquid refrigerant.

2. The method of claim 1 wherein the series impedance of the superconducting electrical path, when operating in a non-superconducting mode, is at least N times the series impedance of the non-superconducting electrical path, and wherein N is greater than 1.

3. The method of claim 2 wherein N is greater than or equal to 3.

4. The method of claim 2 wherein N is greater than or equal to 5.

5. The method of claim 1 wherein the superconducting electrical path includes one superconducting electrical cable, whereby the non-superconducting electrical path is external of the superconducting electrical cable.

6. The method of claim 1 wherein the superconducting electrical path includes two or more superconducting electrical cables.

7. The method of claim 1 wherein the non-superconducting electrical path includes at least one non-superconducting electrical cable.

8. The method of claim 1 wherein the non-superconducting electrical path includes at least one non-superconducting electrical overhead line.

9. The method of claim 1 wherein the non-superconducting electrical path includes at least one of: one or more buses; one or more substations; one or more reactor assemblies; and one or more fast switch assemblies.

10. The method of claim 5 wherein the superconducting electrical cable includes one or more HTS conductors, the method further comprising:

configuring at least one of the one or more HTS conductors to operate in a superconducting mode below a critical current level.

11. The method of claim 10 further comprising:

configuring at least one of the one or more HTS conductors to operate in a non-superconducting mode at or above the critical current level.

12. The method of claim 5 wherein the superconducting electrical cable includes one or more HTS conductors and at least one of the HTS conductors is constructed of a material chosen from the group consisting of: rare-earth-barium-copper-oxide; thallium-barium-calcium-copper-oxide; bismuth-strontium-calcium-copper-oxide; mercury-barium-calcium-copper-oxide; and any of the $MgB_2$ magnesium diboride compounds.

13. The method of claim 5 wherein the superconducting electrical path includes a fast switch assembly.

14. The method of claim 5 wherein the non-superconducting electrical path includes a reactor assembly.

* * * * *